United States Patent
Wischnat

(10) Patent No.: US 8,081,485 B2
(45) Date of Patent: Dec. 20, 2011

(54) COMPONENT ASSEMBLY

(75) Inventor: Volker Wischnat, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/464,428

(22) Filed: May 12, 2009

(65) Prior Publication Data

US 2009/0272569 A1    Nov. 5, 2009

Related U.S. Application Data

(63) Continuation of application No. PCT/DE2007/002079, filed on Nov. 14, 2007.

(30) Foreign Application Priority Data

Nov. 16, 2006  (DE) .......................... 10 2006 054 085

(51) Int. Cl.
- H05K 7/02 (2006.01)
- H05K 7/06 (2006.01)
- H05K 7/08 (2006.01)
- H05K 7/10 (2006.01)

(52) U.S. Cl. ......... 361/760; 361/303; 361/773; 361/782

(58) Field of Classification Search .......... 361/300–318, 361/770–774

See application file for complete search history.

(56) References Cited

U.S. PATENT DOCUMENTS

| | | | | |
|---|---|---|---|---|
| 5,931,371 | A | * 8/1999 | Pao et al. | 228/180.22 |
| 5,936,846 | A | * 8/1999 | Jairazbhoy et al. | 361/770 |
| 6,326,239 | B1 | 12/2001 | Asai et al. | |
| 6,380,619 | B2 | * 4/2002 | Ahiko et al. | 257/703 |
| 6,807,047 | B2 | * 10/2004 | Togashi et al. | 361/321.2 |
| 6,965,507 | B2 | * 11/2005 | Togashi et al. | 361/303 |
| 7,359,178 | B2 | 4/2008 | Feichtinger | |
| 2003/0103320 | A1 | 6/2003 | Shimada et al. | |

FOREIGN PATENT DOCUMENTS

| | | |
|---|---|---|
| DE | 199 15 745 A1 | 10/1999 |
| DE | 101 32 798 C1 | 1/2003 |
| DE | 10 2004 016 146 A1 | 10/2005 |
| DE | 10 2005 016 590 A1 | 10/2006 |
| JP | 2000-124059 A | 4/2000 |
| JP | 2004-228544 A | 8/2004 |
| JP | 2004-278508 A | 10/2004 |
| JP | 2006-216781 A | 8/2006 |

OTHER PUBLICATIONS

"Multilayer Ceramic Capacitors," Data Book 2003, Edition Nov. 2002, 4 pages, www.epcos.com.

* cited by examiner

Primary Examiner — Tuan T Dinh
(74) Attorney, Agent, or Firm — Slater & Matsil, L.L.P.

(57) ABSTRACT

A component assembly includes an electric component with a body and a carrier substrate on which the component is fixed by means of a conductive adhesive layer. External electrical contacts that have a planar surface are arranged on the lower side of the body. The conductive adhesive acts upon the body in at least one contact region that is devoid of the external electrical contacts.

21 Claims, 2 Drawing Sheets

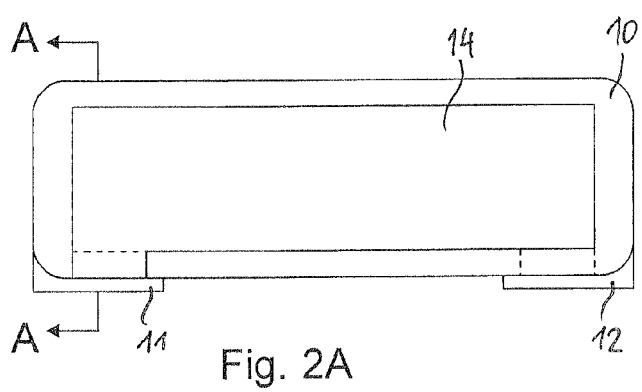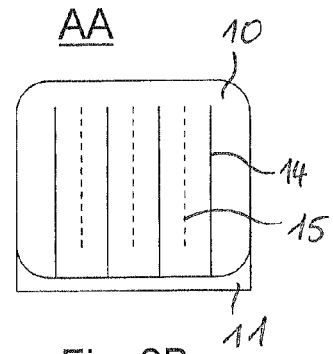
Fig. 2A　　　Fig. 2B
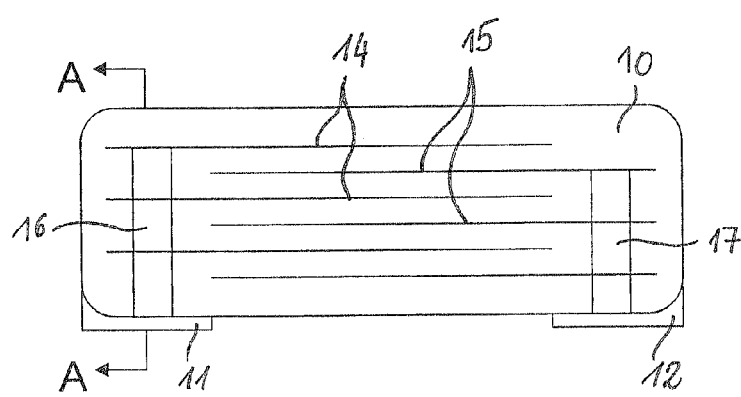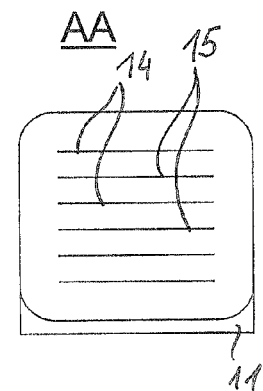
Fig. 3A　　　Fig. 3B
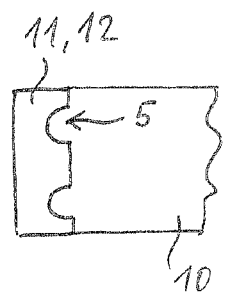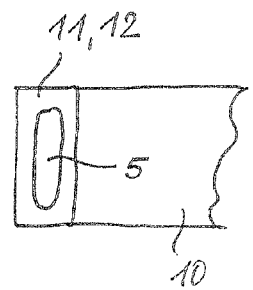
Fig. 4A　　　Fig. 4B
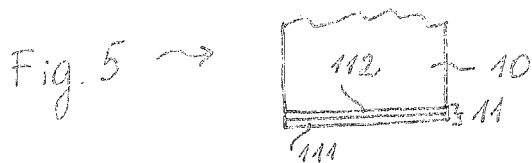
Fig. 5

COMPONENT ASSEMBLY

This application is a continuation of co-pending International Application No. PCT/DE2007/002079, filed Nov. 14, 2007, which designated the United States and was not published in English, and which claims priority to German Application No. 10 2006 054 085.9 filed Nov. 16, 2006, both of which applications are incorporated herein by reference.

BACKGROUND

A ceramic-based, multilayer component is known from the German patent publication DE 10132798 C1.

SUMMARY

A component assembly is specified that comprises an electrical component with a body and a carrier substrate, on which the component is fixed by means of a conductive adhesive layer. External electrical contacts having a flat surface are arranged on the underside of the body. The conductive adhesive contacts the body at least one contact area that is free of external electrical contacts.

The body preferably contains a sintered ceramic material. It was found that the conductive adhesive adheres well to ceramic surfaces. It is therefore advantageous if the body and the carrier substrate are additionally bonded to one another directly, i.e., outside the external electrical contacts situated between them.

Compared with external contacts that are produced in a dipping process and therefore have a curved surface, the external contacts with a flat surface are distinguished by a lower manufacturing tolerance, particularly with regard to their height. The distance between the carrier substrate and the body is then substantially constant.

The excess conductive adhesive can be guided through a gap between the carrier substrate and the body. How far the conductive adhesive penetrates into the gap depends on the wetting properties of the adhesive and the gap size. Therefore, a constant gap size is particularly advantageous for estimating the optimal amount of adhesive.

A well-defined amount of the conductive adhesive is applied to the respective external contact surface of the carrier substrate, preferably printed through a stencil. Alternatively, there is the possibility of printing the external contacts of the component with the conductive adhesive. The component is pressed against the carrier substrate, with a part of the conductive adhesive being pressed into the gap. The amount of conductive adhesive to be printed per external contact is dimensioned such that no short circuits result when excess conductive adhesive penetrates into the gap. The conductive adhesive should therefore penetrate less than half the distance between two external contacts. This can be precisely adjusted for external contacts with a planar surface.

The amount of conductive adhesive is calculated such that a tight bond between the carrier substrate and the body is created, due to the excess conductive adhesive that has penetrated into the gap.

The curing of the conductive adhesive takes place in one embodiment at approximately 150° C., e.g., at a temperature that lies below ordinary soldering temperatures.

The external electrical contacts are preferably not produced with a dipping method, but rather with a method in which a conductive paste is formed. They can be produced by printing, for example, in a screen printing process. The conductive paste is baked and galvanically reinforced by a Au or PdNi layer. The external contacts can be produced by applying the conductive paste with a roller, with subsequent baking.

By means of suitable printing methods such as screen printing, external contacts that have a largely planar surface can be produced. A small variation of the layer thickness can thus be maintained.

In a first embodiment, a AgPd layer is printed onto the underside of the body and baked to form external contacts.

In a second embodiment, a copper layer is printed on and baked. Then a Au or PdNi layer is produced on the layer with a galvanic method.

In a third embodiment, a sintered base, for example, a Ni layer, is produced by applying a Ni layer to the unsintered green body of the precursor component, preferably in a screen printing process, and the Ni is "sintered up" in the subsequent sintering of the component. Thereafter a Au or PdNi layer is produced in a galvanic method on this layer.

A stencil is preferably used for the shaping. Not only the footprint of the respective external contact, but also its height, is specified by the stencil.

The height of the external electrical contacts is preferably selected between 10 and 50 μm.

Preferably, all external contacts of the component are arranged on the underside of the body.

In one embodiment, the component is formed as a multilayer component, preferably a multilayer capacitor or MLCC. MLCC stands for multilayer ceramic capacitor.

The multilayer capacitor comprises alternately arranged first and second internal electrodes that are arranged in the body. The first internal electrodes are connected to the first external electrical contact, and the second internal electrodes are connected to the second external electrical contact. The first and second internal electrodes are insulated from one another. A capacitance is formed between areas of the first and second electrodes.

The internal electrodes are oriented parallel to the underside of the body in one embodiment and are connected by means of plated through-holes to the external electrical contacts.

In another embodiment, the internal electrodes are oriented perpendicular to the underside of the body. The internal electrodes can be oriented parallel to the longitudinal axis of the body. They can also be oriented perpendicular to the longitudinal axis of the body.

The body preferably has the shape of a cuboid. The corners of the cuboid are preferably rounded off. The respective external electrical contact extends in one embodiment up to at least one of the rounded corners.

The upper side and at least planar-shaped areas of the side faces of the body are free from external electrical contacts in one embodiment. In this case, all external electrical contacts of the component are arranged on the underside of the body. Thus material can be saved, which is advantageous particularly in the case of Pd-containing external contacts.

The conductive adhesive contains epoxy resin filled with conductive particles, preferably Ag and/or Cu.

The material of the external contacts is selected such that a good adhesion between conductive adhesive and external contact is assured. In an advantageous embodiment, the external electrical contacts have a layer that contains palladium, nickel-palladium, silver-palladium, or some other noble metal. Palladium favors the adhesion of the epoxy resin. The external electrical contacts may also comprise an additional layer, preferably containing copper. This layer, which was already mentioned above, is arranged between the body and the Pd-containing layer, and serves as an electrically conductive layer promoting adhesion.

The external contacts can each have at least one cutout or opening. Thereby a cavity is formed, which is filled with conductive adhesive. An additional contact surface is formed between the conductive adhesive and the body. In one embodiment, the cavity opens into the above-mentioned gap. In another embodiment, the cavity is isolated from the gap.

BRIEF DESCRIPTION OF THE DRAWINGS

The component assembly will now be explained with reference to schematic figures not drawn to scale. The following are shown:

FIGS. 2A, 2B, show in a longitudinal and a cross section, a multilayer component in which the internal electrodes are oriented perpendicular to the external electrical contacts of the component;

FIGS. 3A, 3B, show in a longitudinal and a cross section, a multilayer component in which the internal electrodes are oriented parallel to the external electrical contacts of the component;

FIGS. 4A, 4B, show a respective plan view onto an external contact with a cutout; and FIG. 5, shows an external contact with two layers.

Figure 1A:
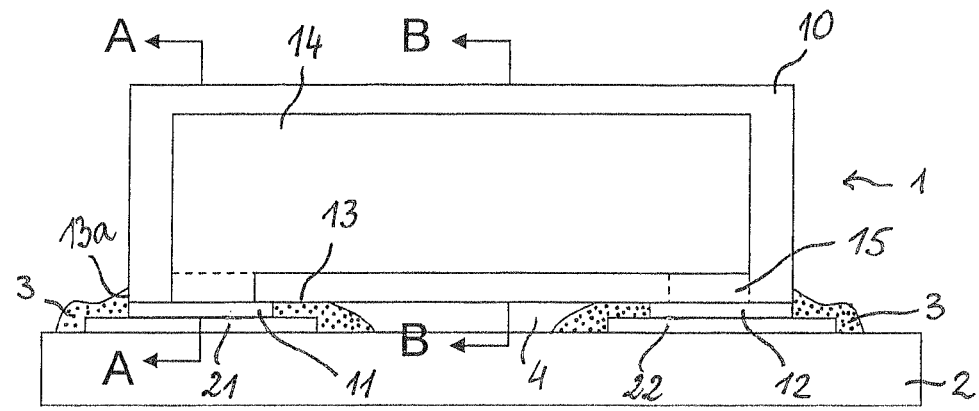
FIGS. 1A, 1B, show a component assembly with a component mounted on a carrier substrate in a first and second longitudinal section.

The following list of reference symbols may be used in conjunction with the drawings:

1 Component
10 Body
11, 12 External electrical contacts of the component
13 Contact region
14, 15 Internal electrodes
2 Carrier substrate
21, 22 External contact areas of the carrier substrate
23 Contact region
3 Conductive adhesive
4 Gap
5 Recess

DETAILED DESCRIPTION OF ILLUSTRATIVE EMBODIMENTS

Figure 1B:
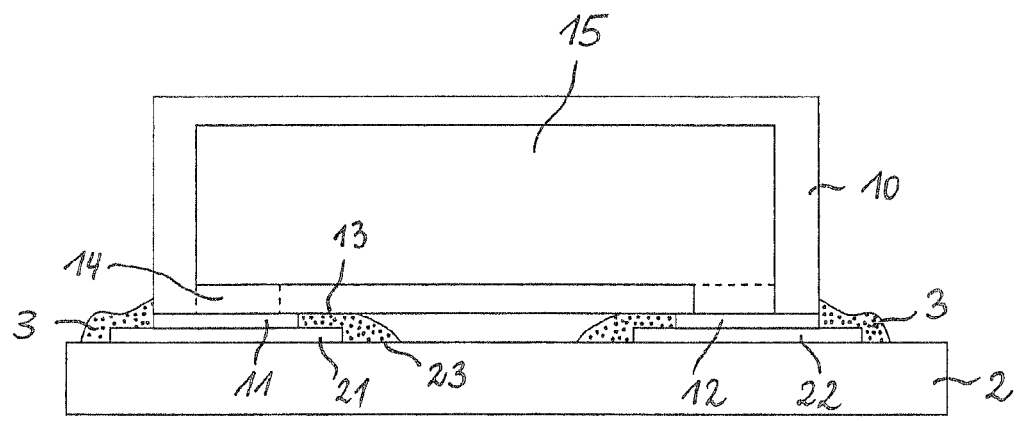

Various views of a component assembly are shown in FIGS. 1A, 1B. This assembly comprises an SMD-capable electrical component 1 that is mounted on a carrier substrate 2. SMD stands for surface mounted device.

Component 1 comprises a body 10, on the underside of which first and second external electrical contacts 11, 12 are arranged. The height of the external contacts 11, 12 is preferably selected to be between 10 and 50 µm. The external contacts 11, 12 have a planar surface that faces the external contact areas of the carrier substrate 2.

First and second external contact areas 21, 22 are arranged on the upper side of carrier substrate 2. Body 10 is fixedly connected to carrier substrate 2 in the area of external contacts 11, 12 by a conductive adhesive 3. The conductive adhesive 3 contacts body 10 in a contact region 13 and contacts carrier substrate 2 in a contact region 23.

A narrow gap 4, which is partially filled with conductive adhesive 3, is formed between body 10 and carrier substrate 2.

The conductive adhesive 3 forms a strong connection between body 10 and carrier substrate 2, the cross section of which connection exceeds that of external contacts 11, 12 and of external contact areas 21, 22. Thus, a particularly good adhesive strength of the component on the carrier can be guaranteed.

The contact region 13 is arranged between two external electrical contacts 21, 22 on the underside of body 10. An additional contact region 13a, which is arranged on the side face of body 10, is also present.

A stack of first internal electrodes 14, each conductively connected to first external contact 11, is arranged in body 10. A stack of second internal electrodes 15, each conductively connected to second external contact 12, is arranged in body 10.

Figure 1C:
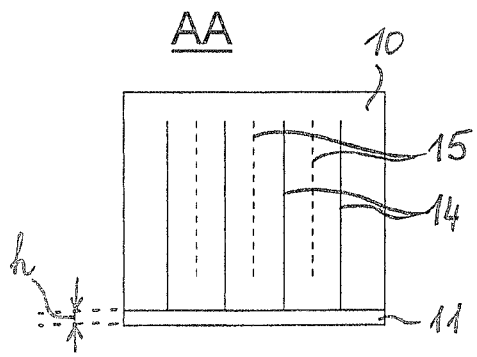
FIGS. 1C, 1D, show the component according to FIGS. 1A, 1B in a first and second cross section.
Figure 1D:
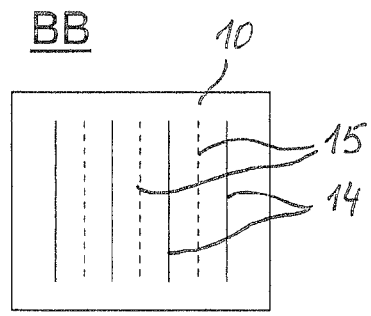

A cross section AA of component 1 is shown in FIG. 1C, and a cross section BB, in FIG. 1D.

Various views of an electrical multilayer component, which, unlike the previous embodiment, has a body with rounded edges, are shown in FIGS. 2A, 2B. The edges are rounded off by rubbing, for example.

The respective external electrical contacts 11, 12 extend in the longitudinal direction toward the rounded edge formed between the underside and a first or second side face of the body. Although the shape of the external contacts is matched to the rounded edge, the lower surface of the external contacts is flat.

Various views of an additional electrical multilayer component are shown in FIGS. 3A, 3B. In this case, the first internal electrodes 14 are connected to one another and to first external contact 11 of the component by means of a plated through-hole 16 arranged in body 10. The second internal electrodes 15 are connected to one another and to second external contact 12 of the component by means of a plated through-hole 17 arranged in body 10.

External contacts 11, 12 with two recesses 5 are shown in FIG. 4A, and an external contact with a cutout in the form of an opening is shown in FIG. 4B. Several openings per external contact may also be considered.

FIG. 5 shows an external contact 11 that has a first layer 111 and a second layer 112. First layer 111 preferably contains silver-palladium. Second layer 112, which is arranged between first layer 111 and body 10, preferably contains metallic copper.

First layer 111 can contain metallic Pd, PdNi or Au, for example, which is preferably applied galvanically. Second layer 112 can contain metallic Cu, Ag or AgPd, which is applied by screen printing in one embodiment.

In one embodiment it is possible to forgo layer 111 if, for example, layer 112 contains AgPd. This layer is preferably applied by screen printing.

What is claimed is:

1. A component assembly, comprising:
an electric component with a body and external electrical contacts arranged on an underside of the body, the external electrical contacts each having a substantially planar flat surface,
a carrier substrate, on which the component is fixed by means of a conductive adhesive layer such that the distance between the external electrical contacts of the body is constant, wherein the conductive adhesive layer contacts the body in at least one contact region apart from the external electrical contacts;
wherein the external electrical contacts each have at least one cutout filled with conductive adhesive.

2. A component assembly, comprising:
an electric component with a body and external electrical contacts arranged on an underside of the body, the external electrical contacts having a flat surface, wherein the external electrical contacts comprise contacts produced in a printing process;
a carrier substrate, on which the component is fixed by means of a conductive adhesive layer such that the distance between the carrier substrate and the external electrical contacts of the body is constant, wherein the conductive adhesive layer contacts the body in at least one contact region apart from the external electrical contacts.

3. The component assembly according to claim 1, wherein the external electrical contacts each have a height that does not exceed 50 µm.

4. The component assembly according to claim 1, wherein the external electrical contacts each have a first layer that contains silver-palladium.

5. The component assembly according to claim 1, wherein a part of the conductive adhesive layer is arranged in a gap formed between the body and the carrier substrate.

6. The component assembly according to claim 1,
wherein the component comprises alternately arranged first and second internal electrodes, and
wherein the first internal electrodes are electrically connected to a first external electrical contact, and the second internal electrodes are electrically connected to a second external electrical contact.

7. The component assembly according to claim 1,
wherein the body has the shape of a cuboid with rounded corners, and
wherein each external electrical contact extends up to at least one of the rounded corners.

8. The component assembly according to claim 1, wherein at least planar-shaped areas of side faces of the body are free from external electrical contacts.

9. The component assembly according to claim 1, wherein the conductive adhesive layer comprises epoxy resin filled with conductive particles.

10. The component assembly according to claim 4, wherein the external electrical contacts further comprise a copper-containing second layer arranged between the body and the first layer.

11. The component assembly according to claim 6, wherein the first internal electrodes and the second internal electrodes are oriented parallel to the underside of the body, and are electrically connected by plated through-holes to the external electrical contacts.

12. The component assembly according to claim 6, wherein the first internal electrodes and the second internal electrodes are oriented perpendicular to the underside of the body.

13. A component assembly, comprising:
an electric component with a body and external electrical contacts that are substantially planar and are arranged on an underside of the body, the external electrical contacts each having a flat surface with at least one recess; and
a carrier substrate, the electric component being fixed to the carrier substrate by means of a conductive adhesive layer so that the conductive adhesive layer at least partially fills the recess of each external electrical contact, each recess being arranged between the body of the electrical component and the carrier substrate, wherein a part of the conductive adhesive layer is arranged in a gap between the body and the carrier substrate filled with conductive adhesive.

14. The component assembly according to claim 13, wherein the conductive adhesive layer contacts the body in at least one contact region apart from the external electrical contacts.

15. The component assembly according to claim 13 wherein the external electrical contacts each have a height that does not exceed 50 µm.

16. The component assembly according to claim 13, wherein the external electrical contacts each have a first layer that contains silver-palladium.

17. The component assembly according to claim 13, wherein the component comprises alternately arranged first and second internal electrodes within the body, wherein first internal electrodes are electrically connected to a first external electrical contact, and the second internal electrodes are electrically connected to a second external electrical contact.

18. The component assembly according to claim 13, wherein the conductive adhesive layer comprises epoxy resin filled with conductive particles.

19. The component assembly according to claim 16, wherein the external electrical contacts comprise a copper-containing second layer arranged between the body and the first layer.

20. The component assembly according to claim 17, wherein the first and second internal electrodes are oriented parallel to the underside of the body and are electrically connected to the external electrical contacts by means of plated through-holes.

21. The component assembly according to claim 17, wherein the first and second internal electrodes are oriented perpendicular to the underside of the body.

\* \* \* \* \*